(12) United States Patent
Kawana et al.

(10) Patent No.: US 9,010,299 B2
(45) Date of Patent: Apr. 21, 2015

(54) ENGINE TOOL

(75) Inventors: Kazuyuki Kawana, Hitachinaka (JP);
Kouhei Oda, Hitachinaka (JP)

(73) Assignee: Hitachi Koki Co., Ltd, Tokyo (JP)

( * ) Notice: Subject to any disclaimer, the term of this patent is extended or adjusted under 35 U.S.C. 154(b) by 111 days.

(21) Appl. No.: 12/618,589

(22) Filed: Nov. 13, 2009

(65) Prior Publication Data

US 2010/0122683 A1 May 20, 2010

(30) Foreign Application Priority Data

Nov. 14, 2008 (JP) .................................. 2008-291833

(51) Int. Cl.
| F02B 63/02 | (2006.01) |
| B27B 17/00 | (2006.01) |
| B25F 5/00 | (2006.01) |
| B27B 17/08 | (2006.01) |

(52) U.S. Cl.
CPC ................ B25F 5/008 (2013.01); B27B 17/08 (2013.01); F02B 63/02 (2013.01); *H01L 2924/0002* (2013.01)

(58) Field of Classification Search
CPC .............. F02M 35/044; F02M 35/048; F02M 35/0146; F02M 35/06; F02M 17/00
USPC ........ 55/385.1, 419; 123/198 E, 556, 184.46, 123/41.65, 41.69; D8/8
See application file for complete search history.

(56) References Cited

U.S. PATENT DOCUMENTS

| 4,497,285 A | * | 2/1985 | Kondo ....................... 123/41.65 |
| 4,626,266 A | * | 12/1986 | Sasaki .......................... 55/385.1 |
| 4,787,924 A | * | 11/1988 | Nagashima et al. .......... 55/385.1 |
| 5,438,965 A | * | 8/1995 | Aronsson et al. .......... 123/198 E |
| 6,213,066 B1 | * | 4/2001 | Dahlberg et al. ............ 123/73 A |
| 6,314,922 B1 | | 11/2001 | Zimmermann et al. |
| 6,378,467 B1 | | 4/2002 | Kobayashi et al. |
| 6,427,641 B1 | | 8/2002 | Ziegs |
| 6,807,954 B2 | * | 10/2004 | Nara et al. ..................... 123/556 |
| 2003/0221640 A1 | | 12/2003 | Ohsawa |

FOREIGN PATENT DOCUMENTS

| JP | 61-160201 A | 7/1986 |
| JP | 3-78963 A | 8/1991 |

* cited by examiner

*Primary Examiner* — Lindsay Low
*Assistant Examiner* — Kevin Lathers
(74) *Attorney, Agent, or Firm* — Kilpatrick Townsend & Stockton LLP

(57) ABSTRACT

An engine tool comprises an engine, a housing retaining the engine, a top cover provided above the housing, and an air cleaner room provided at the housing. The engine tool is structured in such a way that external air introduced in the air cleaner room or the housing flows through a space formed between the housing and the top cover. The engine tool further comprises a handle part which is grabbed by a user and which is provided above the top cover. External air flows through a space formed between an area of the top cover where the handle part is provided and the housing. The engine tool still further comprises an air inlet for introducing external air provided at a front part of the engine tool.

11 Claims, 12 Drawing Sheets

LEFT ← → RIGHT

ENGINE TOOL

CROSS-REFERENCES TO RELATED APPLICATIONS

This application is based on Japanese Patent Application No. 2008-291833 filed on Nov. 14, 2008 and including specification, claims, drawings and summary. The disclosure of the above Japanese Patent Application is incorporated herein by reference in its entirety.

BACKGROUND OF THE INVENTION

1. Field of the Invention

The present invention relates to an engine tool with a small engine like a chainsaw, and more particularly, an engine tool having a devised air cleaner room or airflow path for engine cooling.

2. Description of the Related Art

Engine tools like chainsaws for cutting a shaft of a tree or a branch thereof are generally driven by a small engine. In general, because a user cuts a branch above his/her head or climbs the tree while holding the chainsaw, the chainsaw is small and light-weighted so that the user can easily lift up the chainsaw by one hand. The chainsaw also has a handle so that the user can easily hold the chainsaw. In order to miniaturize the chainsaw, various devises are made in arrangement of an engine, an exhaust pipe, a saw chain part, and the like, and in attachment of each equipment to a housing. According to a chainsaw disclosed in Unexamined Japanese Patent Application KOKAI Publication No. S61-160201, a cylinder of an engine is arranged inside a main body casing, and an air cleaner room is arranged at the front side of the main body casing. Such a chainsaw is configured in such a way that the main body casing has a compact height in the vertical direction. Moreover, external air is sucked directly into the air cleaner room through communicating holes provided above the air cleaner room.

Regarding letting in of external air into an air cleaner room, according to the technology disclosed in Unexamined Japanese Utility Model Application KOKAI Publication No. H03-78963, external air is sucked through an opening formed in a rear face of a chainsaw and an openable/closable opening formed in a retention wall relative to an engine. Air warmed up as flowing around a cylinder of the engine flows into the air cleaner room. Accordingly, even if an external temperature is cold like winter, the chainsaw is maintained in a good operation condition.

According to recent chainsaws, an engine is retained in an integrally-molded housing, and a saw chain part or the like is attached to the housing. The housing is formed of plastic for weight saving. Accordingly, the plastic-made housing has inferior rigidity of a material itself and the strength thereof in comparison with a metallic housing, and the heat dissipation characteristics are also poor.

SUMMARY OF THE INVENTION

The present invention has been made in view of the foregoing circumstances, and it is an object of the present invention to provide an engine tool which does not easily transmit heats of an engine to a user and which allows the user to work comfortably.

To achieve the object, an engine tool according to an aspect of the present invention comprises: an engine; a housing retaining the engine; a top cover provided above the housing; an air cleaner room provided at the housing, and retaining an air cleaner, and wherein external air flows through a space formed between the housing and the top cover, and is introduced into either one of or both of the air cleaner room and the housing.

The engine tool may further comprise a handle part provided above the top cover and is configured to be hold by a user, and wherein the external air may flow through a space between an area of the top cover where the handle part is provided and the housing.

The engine tool may further comprise an air inlet provided at a one side of the engine tool and for introducing the external air, and wherein the air cleaner room is provided at the other side of the engine tool.

The air inlet may be an opening formed in a front part of the top cover or a space formed at a part where the top cover and the housing are connected together.

The air cleaner room may have a first air inlet for introducing external air flowing though a space between the housing and an air cleaner room cover covering the housing, and a second air inlet for introducing external air flowing through the space between the housing and the top cover.

The engine tool may further comprise a fan provided at a crank shaft of the engine to forcedly cool down the engine, and wherein the external air introduced in the housing may cool down a cylinder of the engine, and be exhausted to an exterior of the housing by the fan.

The first air inlet may be opened downwardly from the air cleaner room, and the second air inlet may be communicated with the space formed between the housing and the top cover from the air cleaner room.

The engine tool may further comprise a carburetor disposed in the air cleaner room.

According to the engine tool of the present invention, heat from the engine is not likely to be transmitted to a user, so that the user can work comfortably.

BRIEF DESCRIPTION OF THE DRAWINGS

The object and other objects and advantages of the present invention will become more apparent upon reading of the following detailed description and the accompanying drawings in which.

DETAILED DESCRIPTION OF THE PREFERRED EMBODIMENT

Figure 1:
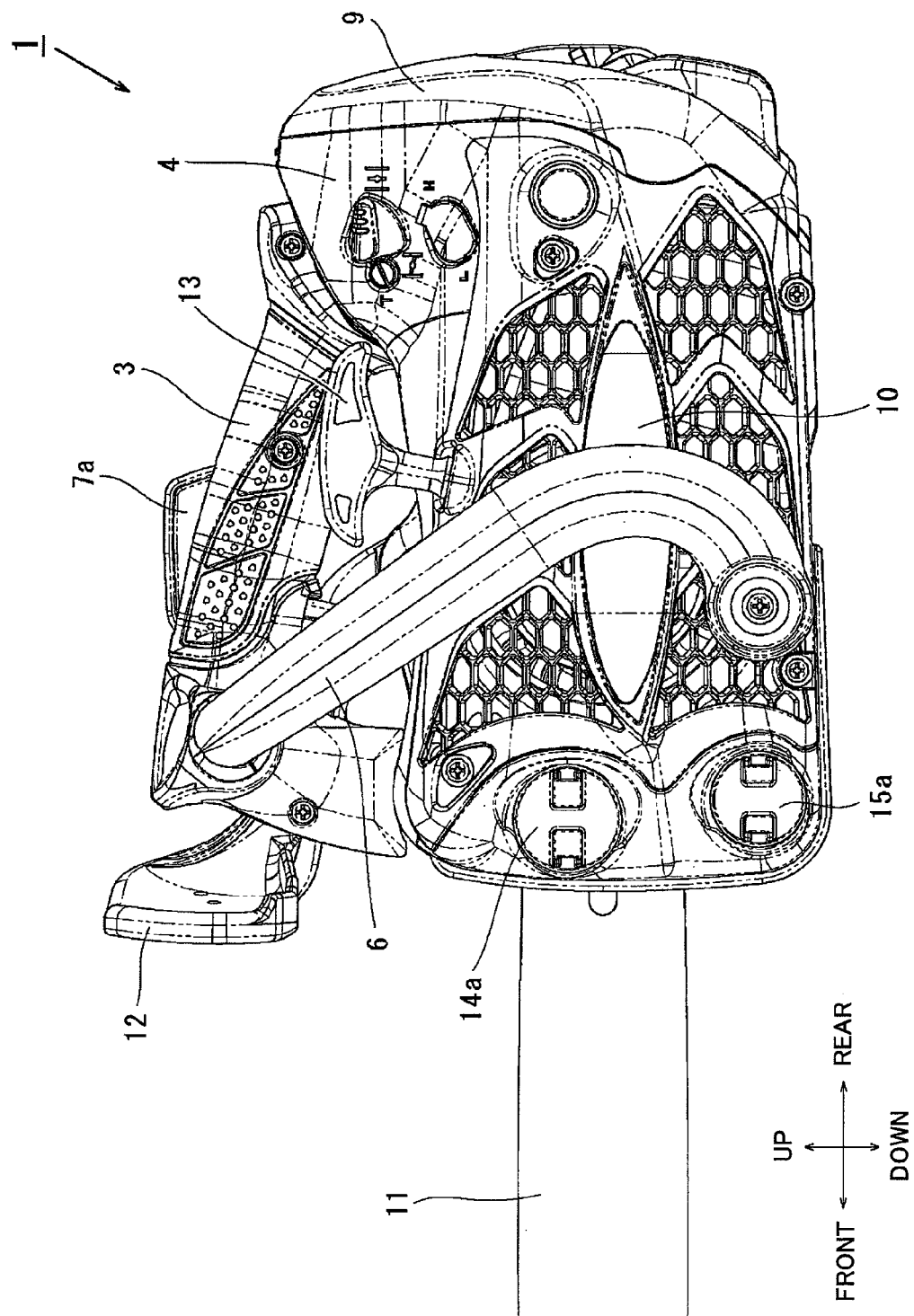
FIG. 1 is a left side view showing a chainsaw according to an embodiment of the present invention.
Figure 2:
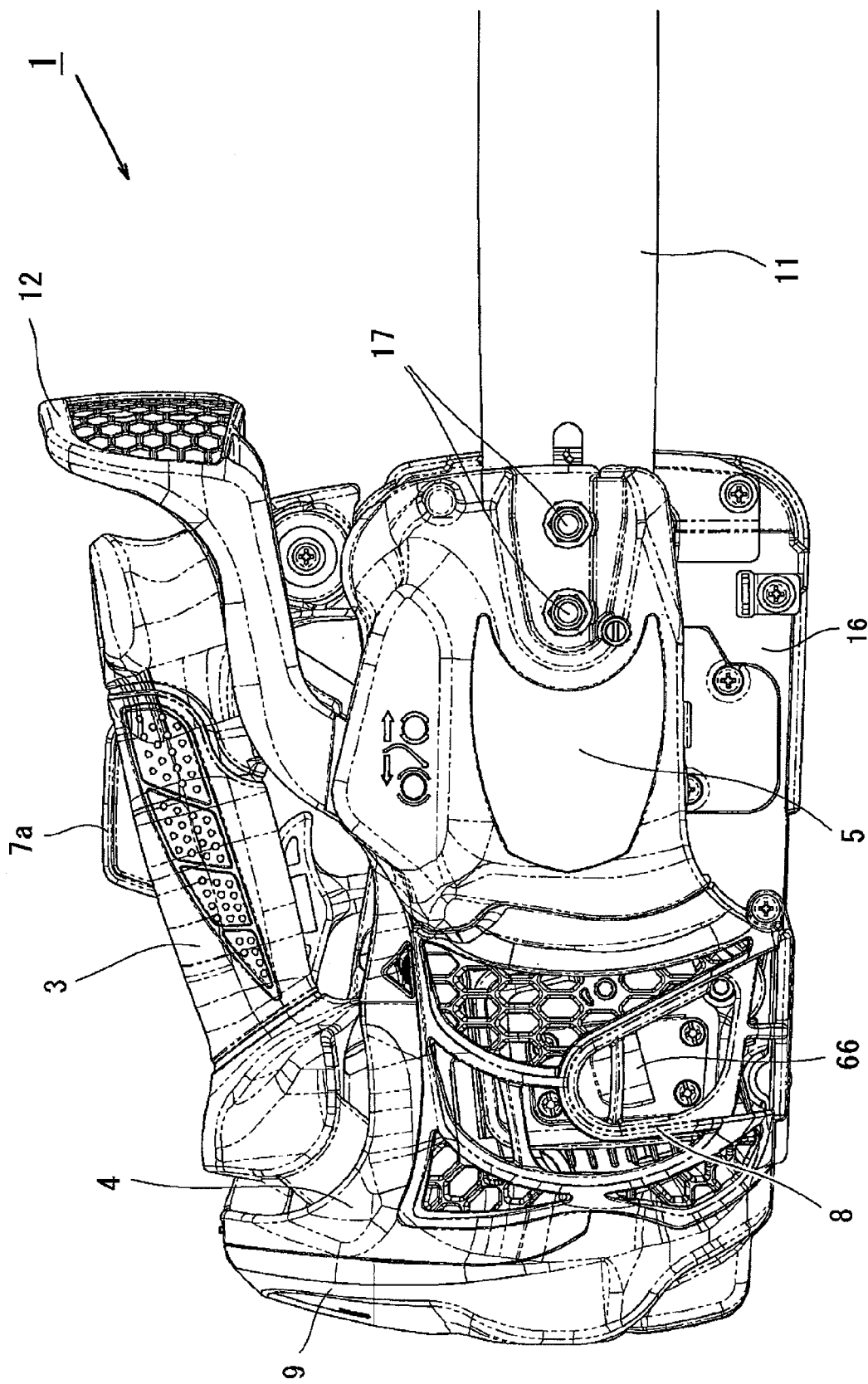
FIG. 2 is a right side view showing the chainsaw of the embodiment.
Figure 3:
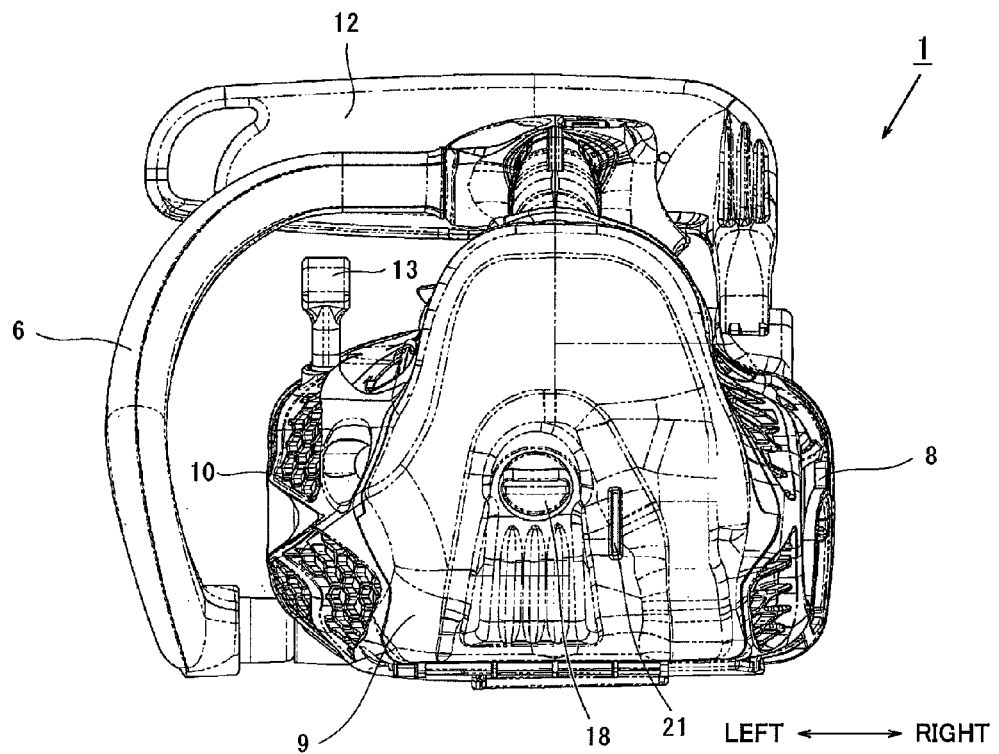
FIG. 3 is a back view showing the chainsaw of the embodiment.

An explanation will be given of an embodiment of the present invention with reference to accompanying drawings. The explanation will be given of a chainsaw as an example of an engine tool, the same structural elements will be denoted by the same reference numerals across the accompanying drawings, and the repeated explanation will be omitted. FIG. 1 is a left side view of a chainsaw of the embodiment, FIG. 2 is a right side view, and FIG. 3 is a back view.

As shown in FIG. 1, a chainsaw 1 has a small engine, such as a two-cycle engine or a four-cycle engine, as a power source. In the specification, backward and forward and vertical directions are defined as shown in FIG. 1 with a user being holding the chainsaw 1, and leftward and rightward directions are defined as shown in FIG. 3. A guide bar 11 protrudes from the front part of a main body of the chainsaw 1. A saw chain (not shown) is wound around the circumferential edge of the guide bar 11. The saw chain is rotated at a fast speed by an engine to cut a shaft of a tree or a branch thereof. A main handle 3 is provided at the upper part of the chainsaw 1. A front handle 6 is provided in such a manner as to extend laterally and downwardly from the front end part of the main handle 3 (see FIG. 3).

The main handle 3 is for allowing the user to grip it with his/her right hand. The front handle 6 is for allowing the user to grip it with his/her left hand. A safety trigger 7a is provided in the vicinity of the upper part of the main handle 3. Moreover, an ignition switch 7b (see FIG. 4) is provided in the vicinity of the front end of the main handle 3. A hand guard 12 for preventing a branch or a cut object from hitting the hand of the user is provided at the front of the main handle 3. The left part of the chainsaw 1 is covered by a left cover 10.

A recoil starter (not shown) for activating an engine is retained inwardly of the left cover 10. A starter handle 13 for pulling the starter is attached to an upper part of the left cover 10 so as to pass all the way through the left cover 10. A fuel tank and a chain oil tank are arranged frontward of the left cover 10, and a fuel tank cap 14a and a chain oil tank cap 15a are provided. A main body cover 4 covers the rear part of the chainsaw 1 which is located in the vicinity of the rear end part of the main handle 3. A rear cover 9 covers the rear part of the main body cover 4.

As shown in FIG. 2, the guide bar 11 is fixed to the front-right part of the chainsaw 1 by means of two bolts (not shown) and nuts 17. A driving force transmitting mechanism (not shown) to the saw chain is attached to the right side of the chainsaw 1, and is covered by a right cover 5. Meshed-ventilation openings are formed in the major part of the surface of the right cover 5. A muffler guard 8 for guarding the user from heats from a muffler 66 of an engine is attached to the rear part of the right cover 5.

As shown in FIG. 3, the rear cover 9 is provided at the rear end part of the chainsaw 1. The rear cover 9 has not only a function of covering the rear end part of the housing 16, but also a function as an air cleaner room cover of defining an air cleaner room 39 (see FIG. 8) to be discussed later. The rear cover 9 is detachably fixed to the housing 16 (see FIG. 4) by a fix screw 18. A pullout type hook 21 is provided at the right of the fix screw 18. The hook 21 is for hooking a rope 1 to pull up the chainsaw 1 to a higher position by the rope when, for example, the user works on a tree.

Figure 4:
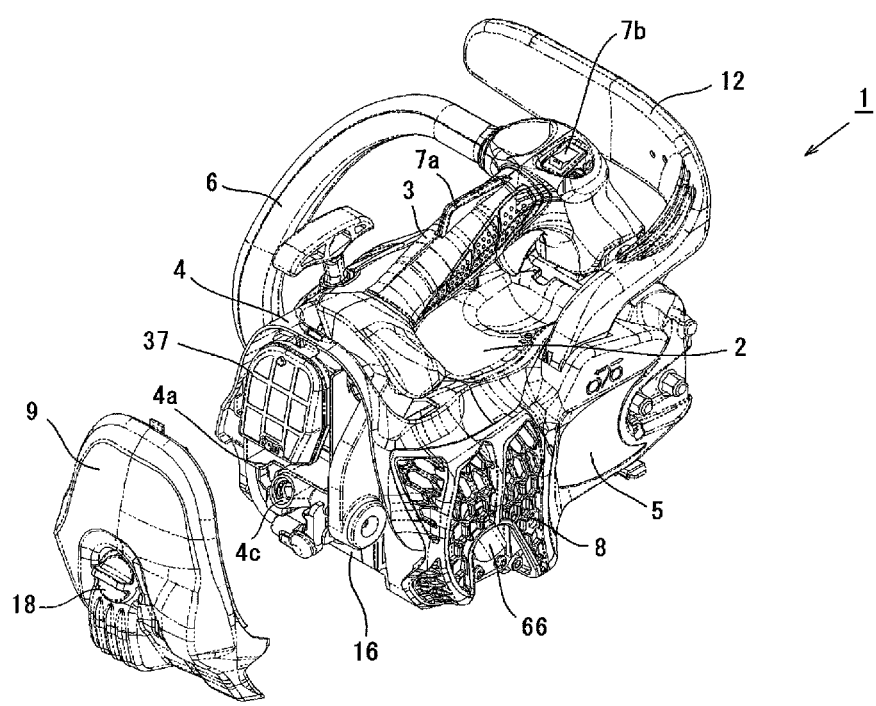
FIG. 4 is a perspective view showing the chainsaw with a rear cover being detached by rotating a fix screw according to the embodiment.

FIG. 4 is a perspective view showing a condition in which the rear cover 9 is detached by rotating the fix screw 18. The fix screw 18 is screwed with a screw hole 4c provided at the rear part of the main body cover 4 and downwardly of an air cleaner 37. The main handle 3 is arranged at the front of the main body cover 4 and upwardly of a top cover 2. The ignition switch 7b which is a switch for an engine and the safety trigger 7a are provided at the main handle 3. The front handle 6 extends leftward from the front part of the main handle 3.

As the rear cover 9 is detached from the housing 16, the air cleaner room 39 (see FIG. 8) is revealed, and it becomes possible for the user to access the air cleaner 37 provided inside the air cleaner room 39. The air cleaner room 39 is defined by the rear part of the main body cover 4 and the internal part of the rear cover 9. The main body cover 4 has a notch 4a formed at the rear part thereof. The notch 4a forms first air inlet 35 (see FIG. 8) for letting external air in the air cleaner room 39. The first air inlet 35 and a second air inlet 36 (see FIG. 8) further formed at the air cleaner room 39 will be discussed in detail later. Air taken through the first and second air inlets is allowed to flow to an engine 50 through the air cleaner 37 and an intake manifold (not shown).

Figure 5:
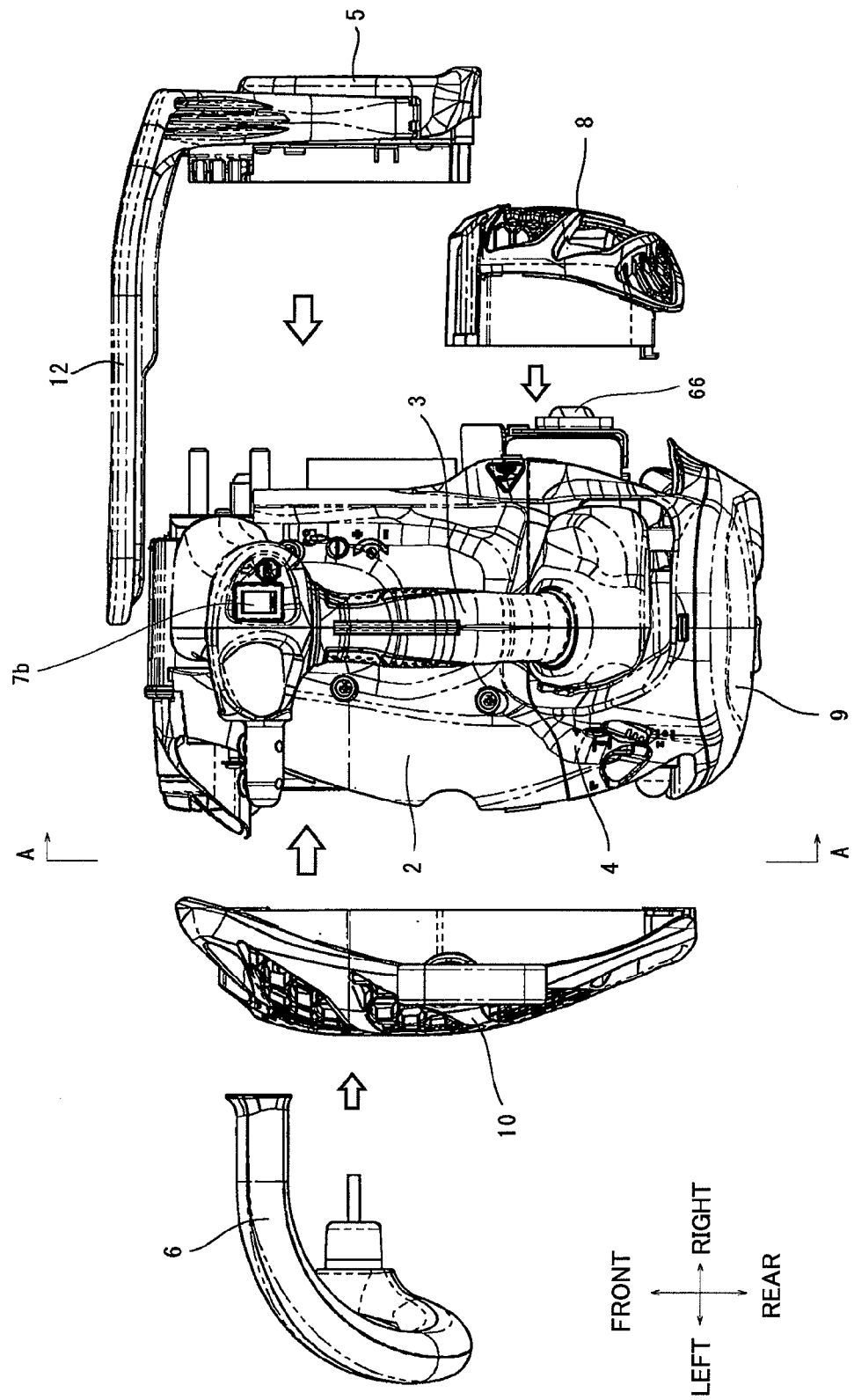
FIG. 5 is a top view showing the chainsaw as viewed from the above with a front handle, a left cover, a muffler guard, and an assemble unit including a hand guard and a right cover being detached.

FIG. 5 is a top view of the chainsaw 1 with the front handle 6, the left cover 10, the muffler guard 8, and an assemble unit of the hand guard 12 and the right cover 5 being detached from the housing 16. FIG. 5 shows a condition in which the guide bar 11 (see FIG. 1) is also removed. FIG. 5 also shows a condition in which the top cover 2, the main body cover 4, and the main handle 3 are attached to the upper part of the housing 16. FIG. 5 further shows a condition in which the rear cover 9 is attached to the rear part of the housing 16.

The left cover 10 and the front handle 6 are attached to the left part of the housing 16 of the chainsaw 1. The hand guard 12 and the right cover 5 are attached to the right part of the housing 16 after the non-illustrated guide bar 11 is attached. The muffler guard 8 is attached rearward of the right cover 5 at a portion where the muffler guard 8 can cover the muffler 66.

Figure 6:
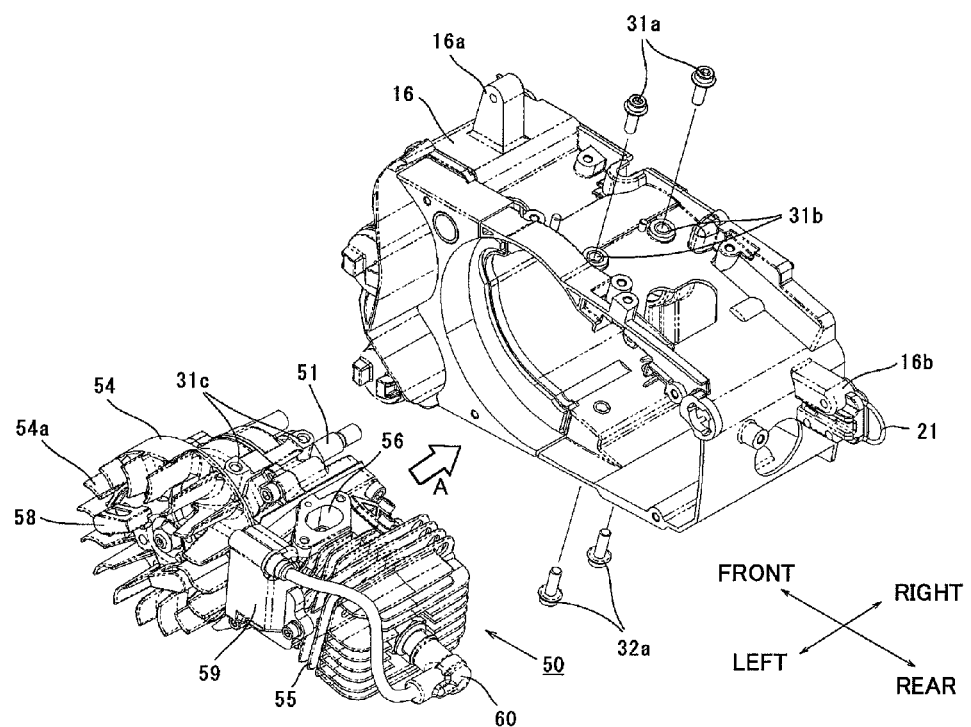
FIG. 6 is perspective view for explaining a shape of a housing of the chainsaw of the embodiment and how an engine is attached.

FIG. 6 is a perspective view for explaining the shape of the housing 16 and how the engine 50 is attached. The housing 16 has not only a function of retaining the engine 50, but also a function as a frame of the chainsaw 1. That is, the chainsaw 1 employs a structure that the guide bar 11, various covers and handles are attached to the housing 16. In the chainsaw 1 of the embodiment, the engine 50 is a so-called transverse-mount type that the movement direction of a piston is substantially horizontal. Accordingly, the engine 50 is inserted into the housing 16 from the left as indicated by an arrow in the figure. The housing 16 is formed by, for example, integral molding of a plastic material. A protrusion 16a for fixing the main handle 3 and the upper part of the front handle 6 is integrally formed with the housing 16 at the front part thereof. A protrusion 16b for fixing the rear end of the main handle 3 and for attaching the hook 21 is formed at the rear part of the housing 16. A face (right face) of the housing 16 opposite to the side that the engine 50 is inserted forms a closed space except an opening through which a clank shaft 51 passes and an opening in the vicinity of a cylinder head. The reason why the closed space is formed while restricting such hole and opening is to introduce air for engine cooling from a predetermined opening and to exhaust such air from another predetermined opening.

After the engine 50 is inserted in the direction indicated by an arrow A in FIG. 6, the engine 50 is fixed inside the housing 16 from up and down by four bolts 31a, 32a. The bolt 31a passes all the way through a through-hole 31b and is screwed with a screw hole 31c. The engine 50 is a two-cycle engine, and has an intake port 56 and an exhaust port separated from each other by 90 degree so that the exhaust port is arranged at the right of the intake port 56 arranged in the upper part of a cylinder 55. A flywheel 54 is connected to one end of a clank shaft 51 of the engine 50. Fins 54a are each integrally formed with a part of the flywheel 54, so that the flywheel 54 also functions as a fan. A permanent magnet (not shown) for causing an ignition coil 59 to generate high-voltage electricity for ignition is provided at a part of the outer circumference of the flywheel 54. Clutches 58 to be connected to a starter are provided inwardly of the fins 54a. High-voltage electricity generated by the ignition coil 59 is transmitted to a plug cap 60 through high-voltage codes each extending from the ignition coil 59, and is supplied to individual ignition plugs through the plug cap 60.

Figure 7:
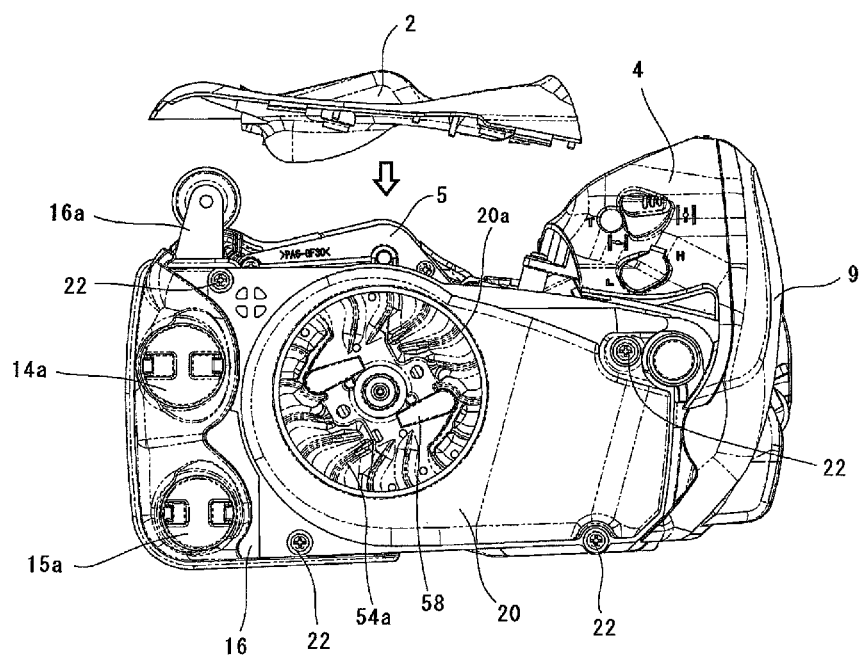
FIG. 7 is a diagram showing the chainsaw of the embodiment along a line A-A in FIG. 5.

FIG. 7 is a diagram along a line A-A in FIG. 5. FIG. 7 shows the chainsaw 1 with the main handle 3 and the top cover 2 being removed from the housing 16, and illustration of the main handle 3 is omitted. The engine 50 is retained in the housing 16. A housing cover 20 is fixed by four screws 22 so as to cover the entire left opening of the housing 16 except a portion of the flywheel 54 exposed through an opening 20a. The opening 20a is formed in a circular shape in the housing cover 20. High-temperature air inside the housing 16 is exhausted by the fins 54a formed with the flywheel 54.

The top cover 2 is for connecting the right cover 5 and the left cover 10 (see FIG. 5) together, and is fixed to the housing 16 with a predetermined clearance so as not to closely contact the housing 16. The reason why the top cover 2 is fixed to the housing 16 with a predetermined clearance is to suppress any transmission of heat from the engine 50 to the top cover 2 as much as possible. In the embodiment, the right and left ends of the top cover 2 do not abut the top face of the housing 16, but abut the upper edge of the right cover 5 and that of the left cover 10. However, the present invention is not limited to such a shape. For example, the right and left ends of the top cover 2 may abut the top face of the housing 16 but may form a tubular path. Moreover, the top cover 2 and the housing 16 may be structured in such a manner as to introduce external air into a space between the top cover 2 and the housing 16 and to form a predetermined airflow. Note that as is clear from FIG. 6, both right and left ends of the top face of the housing 16 are bent upwardly, and the central portion thereof is lower than both right and left ends, so that the top cover 2 and the housing 16 form a substantially tubular path through which air flows.

Figure 8:
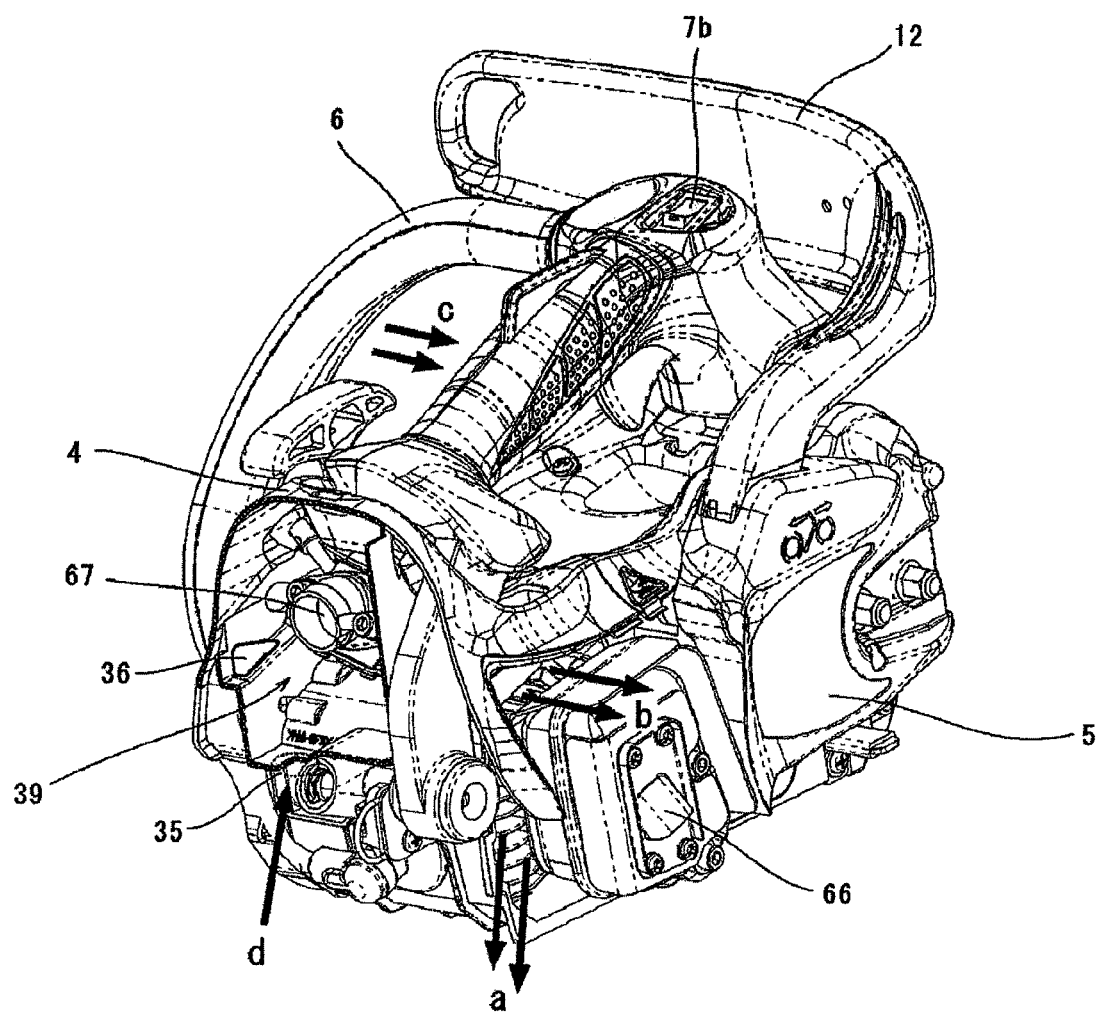
FIG. 8 is a diagram for explaining airflow for forced air cooling of the engine of the chainsaw of the embodiment and airflow into an air cleaner room.

Next, with reference to FIG. 8, an explanation will be given of airflow for forcedly cooling the engine 50 and airflow taken into the air cleaner 37. Air for forcedly cooling the engine 50 is taken in the direction of arrow c which is the axial direction of the fins 54a, allowed to flow through the interior of the housing 16, and exhausted in the directions of arrows a and b from the cylinder of the engine 50. Air for forcedly cooling the engine 50 is forcedly suctioned by rotation of the flywheel 54, so that the direction in which air is suctioned is a substantially-constant direction. Because air inside the housing 16 is exhausted in four directions around the muffler 66, it should be noted that such air is not exhausted only in the directions of the arrows a and b.

In contrast, external air suctioned into the air cleaner room 39 is suctioned through two paths in the embodiment. The first path is a path where external air flows through the first air inlet 35 from the direction of an arrow d and is suctioned in the air cleaner room 39. The first air inlet 35 is defined by the notch 4a of the main body cover 4, and is a part surrounded by an ellipse indicated by a dashed line in FIG. 8. A part with a dark hatching at the opened side of the main body cover 4 is an end of the retention wall defining the air cleaner room 39. The flow of suctioned air can be formed arbitrary in accordance with the characteristics of the engine 50 and how the user holds the chainsaw 1.

The second air inlet 36 is formed in the circumferential wall of the air cleaner room 39 in addition to the first air inlet 35. The second air inlet 36 opens to the space formed between the top cover 2 and the top face of the housing 16. Air between the top cover 2 and the housing 16 is suctioned into the air cleaner room 39 through the second air inlet 36. Note that because the second air inlet 36 is shaped in accordance with the shape of the air cleaner room 39, the second air inlet 36 is formed in a substantially-triangular shape as viewed from a side in FIG. 8. However, the shape of the second air inlet 36 is not limited to a triangular shape. Moreover, as far as the direction in which air is suctioned through the air cleaner 37 is not restricted, the second air inlet 36 may be formed in an arbitrary portion which is communicated with the space between the top cover 2 and the top face of the housing 16 like the front face of the circumferential wall of the air cleaner room 39.

Attention must be paid to a relationship between the size of the first air inlet 35 and that of the second air inlet 36, and a relationship between the shape of the first air inlet 35 and that of the second air inlet 36. The first air inlet 35 and the second air inlet 36 are formed in such a way that the amount of air flowing into the air cleaner room 39 through the first air inlet 35 and through the second air inlet 36 becomes appropriate when the engine 50 is activated. For example, if air is allowed to flow into the air cleaner room 39 only through the first air inlet 35, the intake volume may be insufficient in some cases. However, if air is allowed to flow into the air cleaner room 39 only through the second air inlet 36, because suction power is large, large dusts may be suctioned in the space between the top cover 2 and the housing 16. Accordingly, by providing both first air inlet 35 and second air inlet 36, it is possible to prevent large dusts from being suctioned in the space between the top cover 2 and the housing 16, and an appropriate amount of suctioning can be ensured. In the embodiment, it is desirable that the first air inlet 35 should function as a main air inlet and the second air inlet 36 should function as a secondary air inlet. The first air inlet 35 and the second air inlet 36 are opened in different directions, and take external air from different directions, so that it is possible to dramatically reduce a possibility that the engine 50 is stalled due to any clogging of the air inlet.

Figure 9:
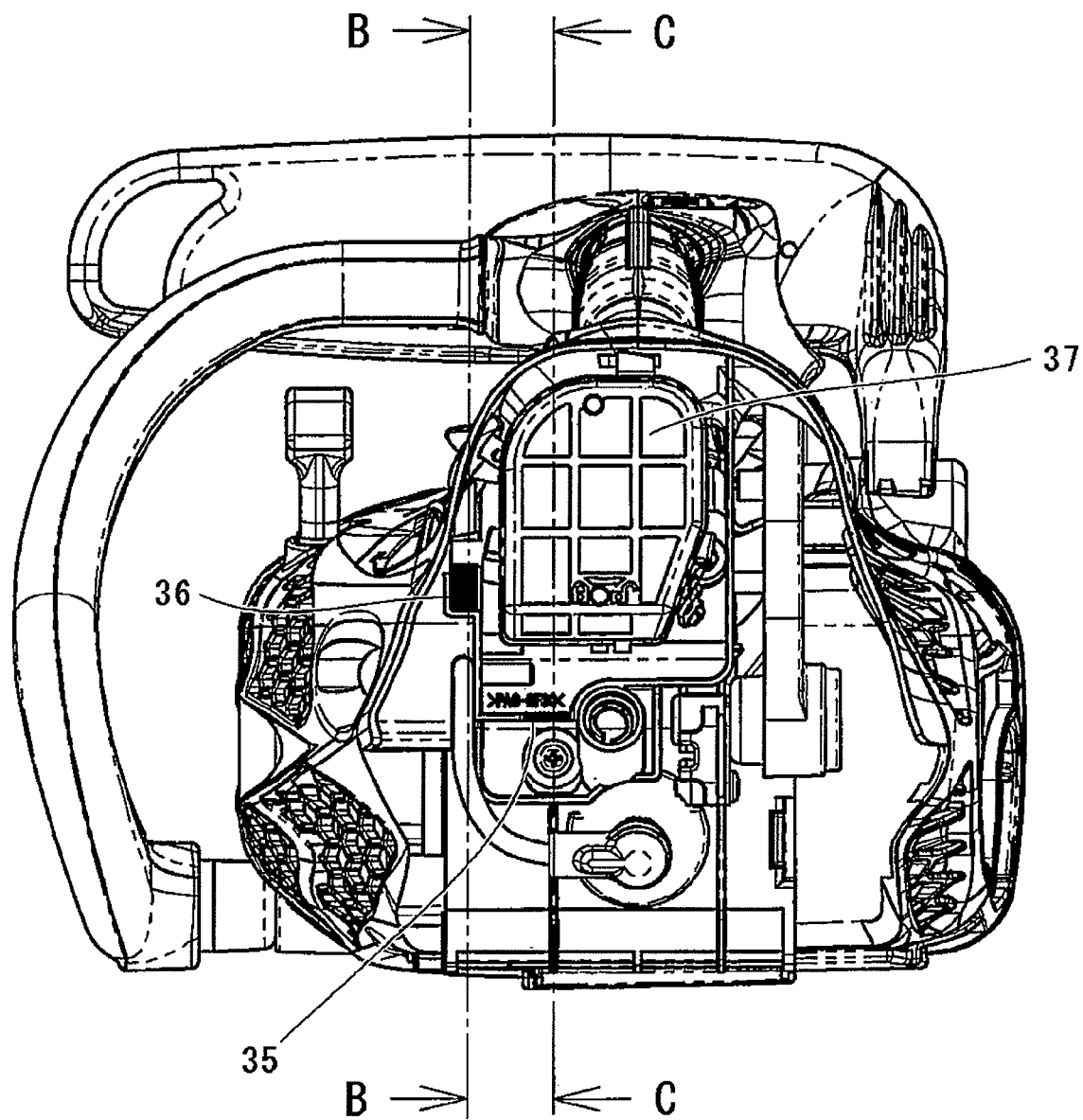
FIG. 9 is a back view showing the chainsaw of the embodiment with the rear cover 9 being detached.

Next, with reference to FIGS. 9 to 11, an explanation will be given of two airflows suctioned into the air cleaner room 39. The path through the second air inlet 36 is one of the characteristics of the present invention. FIG. 9 is a back view showing the chainsaw 1 with the rear cover 9 being detached from the housing 16, FIG. 10 is a cross-sectional view along a line B-B in FIG. 9, and FIG. 11 is a cross-sectional view along a line C-C in FIG. 9.

As shown in FIG. 9, the first air inlet 35 is located at slightly left from the main handle 3 of the chainsaw 1. The second air inlet 36 is located further leftward from the main handle 3 beyond the first air inlet 35. The reason why the first air inlet 35 is located at left from the main handle 3 is to prevent exhaust gas from the muffler 66 from flowing into the air cleaner room 39. The reason why the second air inlet 36 is located at left from the main handle 3 is to avoid a space where a carburetor 67 is arranged. If air in the space between the top cover 2 and the housing 16 is suctioned into the air cleaner room 39 through the second air inlet 36, the position of the second air inlet 36 can be arranged relatively freely. For example, if there is no restriction in, for example, the space where carburetor 67 is arranged, the second air inlet 36 may be formed in the front wall of the air cleaner room 39.

Figure 10:
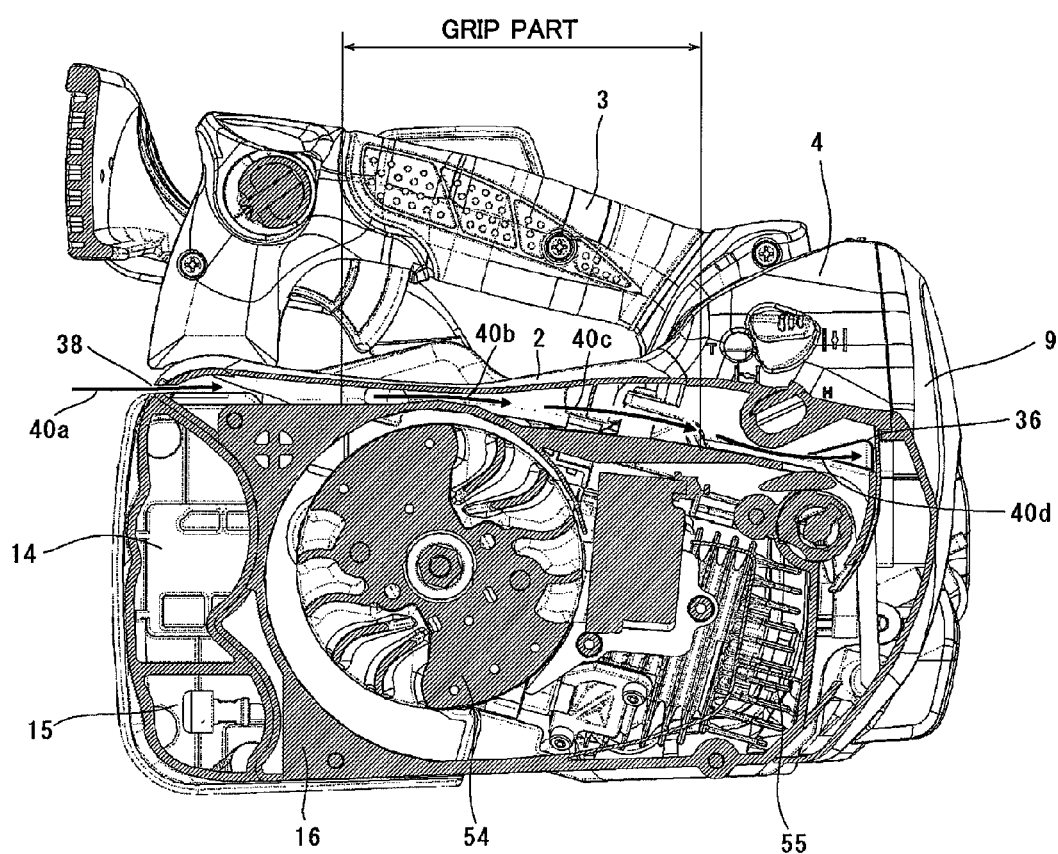
FIG. 10 is a cross-sectional view along a line B-B in FIG. 9.

FIG. 10 is a cross-sectional view along the line B-B in FIG. 9 as viewed from left. As shown in FIG. 10, the second airflow is suctioned from an air inlet 38 at the front of the chainsaw 1 as indicated by an arrow 40a, flows as indicated by arrows 40b, 40c, and 40d, and flows into the air cleaner room 39 through the second air inlet 36. Airflows indicated by the arrows 40b, 40c flow through the space between the top cover 2 and the housing 16. One of the characteristics of the present invention is to form airflow in this space. Because airflow is formed between the top cover 2 and the housing 16 below a grip part of the main handle 3, transmission of heat from the engine 50 to the top cover 2 and the main handle 3 is remarkably reduced. Note that the air inlet 38 at the front of the chainsaw 1 may be formed in a part of the top cover 2. The air inlet 38 may be formed in such a way that external air is taken from a joining clearance between the housing 16 and the top cover 2. Such an air inlet 38 can be easily realized by slightly changing the shape of the top cover 2 or that of the housing 16. As the air inlet 38 is provided at the front of the chainsaw 1, external air can smoothly flow through the space formed between the housing 16 and the top cover 2, so that it is possible to effectively cool down a wide area of the top cover 2. Moreover, in order to suppress any suctioning of dusts into the air inlet 38, the air inlet 38 may be formed with slits, or a mesh may be arranged in the air inlet 38. Note that the fuel tank 14 for the engine 50 and the chain oil tank 15 for lubricating the saw chain are arranged frontward of the housing 16, but no air flows through such part.

Figure 11:
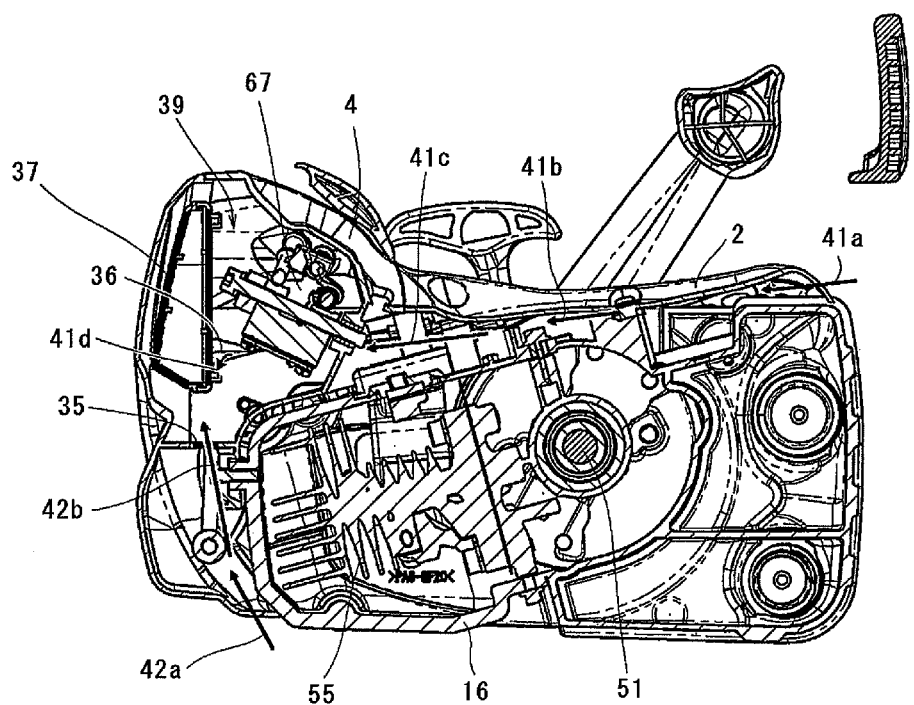
FIG. 11 is a cross-sectional view along a line C-C in FIG. 9.

FIG. 11 is a cross-sectional view along a line C-C in FIG. 9 as viewed from right. The cylinder 55 of the engine 50 is arranged inside the housing 16 in a "slightly horizontal" manner such that the leading end part of the cylinder 55 is directed slightly downwardly. The carburetor 67 and the air cleaner 37 are arranged above the cylinder 55. The air cleaner room 39 is formed as a space retaining the carburetor 67 and the air cleaner 37. As the carburetor 67 and the air cleaner 37 are arranged inside the air cleaner room 39, it is possible to ensure a large dimension of the air cleaner room 39, and to increase the degree of freedom for positions where the first air inlet 35 and the second air inlet 36 are provided. Moreover, as is clear from FIG. 11, as airflows flowing into the air cleaner room 39, there are first airflow flowing in through the first air inlet 35 as indicated by arrows 42a, 42b, and second airflow flowing in through the second air inlet 36 as indicated by arrows 41a to 41d. The path from the arrow 41a to the arrow 41d is communicated with the interior of the air cleaner room 39 from the second air inlet 36 through the left (in the figure, back) of the carburetor 67.

Figure 12:
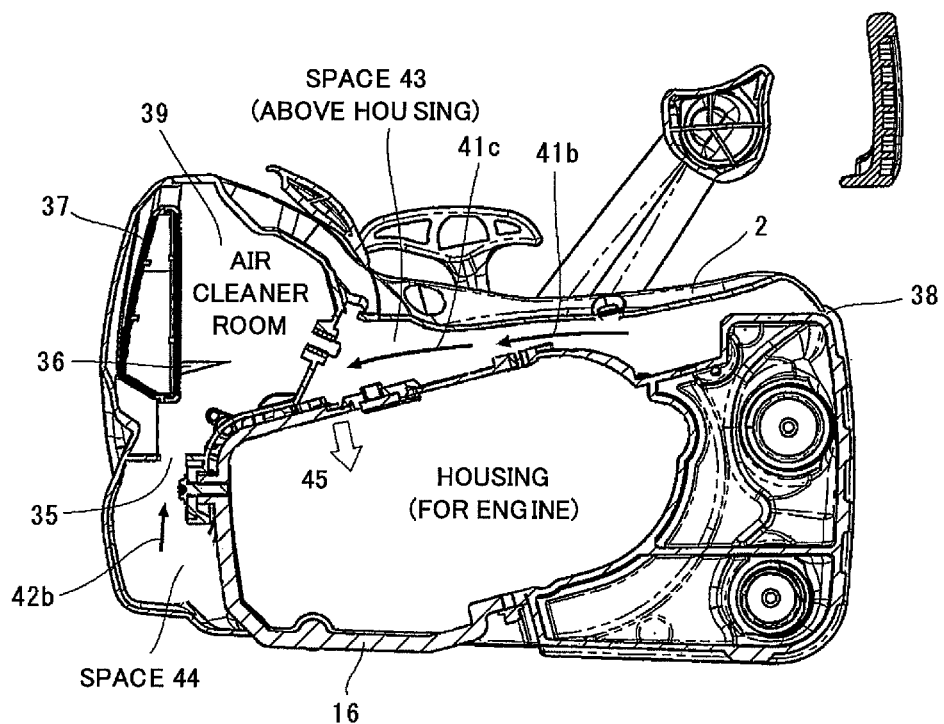
FIG. 12 is an exemplary diagram for explaining airflow of the chainsaw of the embodiment.

Next, with reference to FIG. 12, the airflow of the chainsaw 1 of the embodiment will be exemplary explained. The chainsaw 1 of the embodiment has the air cleaner room 39 rearwardly of the housing 16 for the engine 50. Moreover, a space 43 surrounded by the housing 16 and the top cover 2 is formed above the housing 16. In the embodiment, because the air cleaner room 39 and the housing 16 are so formed as to closely contact with each other, the space 43 is formed frontward of the air cleaner room 39, and a space 44 is formed downward of the air cleaner room 39. The space 44 is formed in order to suppress any suctioning of foreign materials and to reduce suctioning sound. Accordingly, the structure of the space 44 is not always limited to such an arrangement and a shape. Main air suctioned into the air cleaner room 39 is suctioned from the first air inlet 35 through the space 44. In the embodiment, there are provided not only the first air inlet 35 but also the second air inlet 36, so that the path through the space 43 is also formed.

Note that in the embodiment, the second airflow is formed in such a manner as to flow in the air cleaner room 39 through the second air inlet 36, but the formation of airflow is not limited to such a structure. As an air inlet for airflow for forcedly cooling the engine 50, for example, an opening through which air flows as indicated by a whitened arrow 45 may be formed in the housing 16 instead of the second air inlet 36 or together with the second air inlet 36. Airflows indicated by arrows 41b, 41c in FIG. 12 may enter inside the housing 16 as airflow indicated by the whitened arrow 45 through such an opening. Accordingly, the second airflow introduced in the housing 16 cools down the cylinder 55, and is exhausted to the exterior of the housing 16 by the fins 54, so that the effect of cooling down the top cover 2 is further improved. In a word, it is fine if a flow of external air introduced between the housing 16 and the top cover 2 is formed in some way below the grip part of the main handle 3. Accordingly, an electric motor for forming the second airflow may be further provided independently and separately.

It is ideal that the airflows indicated by the arrows 41b, 41c in FIG. 12 flow through a wide area which covers a part from the front end of the grip part of the main handle 3 to the rear end thereof. However, when the shape or the like of the housing 16 and that of the top cover 2 are restricted, it is fine if only airflow indicated by the arrow 41c is formed at an area partially overlapping the grip part of the main handle 3. Moreover, it is fine if the air inlet 38 which is the entrance for the second airflow is not provided in the front face of the chainsaw 1. If an area where the second airflow flows completely or partially overlaps an area below the grip part of the main handle 3 (an area where a hand of the user is positioned), the air inlet 38 can be provided in an arbitrary position. This suppresses any transmission of heat from the engine 50 to the top cover 2.

According to the chainsaw 1 of the embodiment, because the front handle 6 is sufficiently spaced apart from the housing 16, transmission of heat to the front handle 6 is not considered in designing. However, when it is desirable to suppress any transmission of heat from the engine 50 not only to the right hand of the user which holds the main handle 3 but also to another part of the body of the user, it is fine if the chainsaw 1 is structured in such a way that air flows through a space between such a part of the body of the user and the housing 16.

As explained above, according to the embodiment, the chainsaw 1 is so structured as to form the second airflow, but such a structure can be changed and modified in various forms. For example, in cold climates, by plugging off the first air inlet 35 with a non-illustrated rubber seal or the like, the chainsaw 1 can be structured in such a way that warmed-up air flowing through the space between the housing 16 and the top cover 2 flows into the air cleaner room 39 through the second air inlet 36. This suppresses any reduction of the restart characteristics of the carburetor 67 due to cold weather. Moreover, as the first air inlet 35 is plugged off by a non-illustrated rubber seal or the like, even if the chainsaw 1 is buried in snow when the chainsaw 1 is idling, it is possible to prevent the air cleaner 37 from being clogged with snow, and to suppress any engine stall.

The present invention has been explained with reference to the embodiment, but the present invention should not be limited to the foregoing embodiment, and can be changed and modified in various forms. For example, the explanation has been given of the case in which the engine tool is a chainsaw, but the present invention can be applied to other engine tools with a small engine.

Various embodiments and changes may be made thereunto without departing from the broad spirit and scope of the invention. The above-described embodiment is intended to illustrate the present invention, not to limit the scope of the present invention. The scope of the present invention is shown by the attached claims rather than the embodiment. Various modifications made within the meaning of an equivalent of the claims of the invention and within the claims are to be regarded to be in the scope of the present invention.

What is claimed is:

1. An engine tool comprising:
   an engine including a cylinder and a crank case, the cylinder being aligned with a cylinder axis concentric thereto;
   an engine tool housing having a front side, rear side, and a top side extending along the cylinder axis between the front and rear sides; the engine tool housing retaining the engine such that the cylinder axis extends through the front side of the engine tool housing and the rear side of the engine tool housing, the crank case being disposed between the cylinder and the front side of the engine tool housing, and the cylinder being disposed between the crank case and the rear side of the engine tool housing, the top side of the engine tool housing covering the cylinder and the crank case of the engine;
   a fan for introducing external air into the engine tool housing, wherein a rotation axis of the fan extends in parallel with the top side of the engine tool housing;
   a top cover extending along the cylinder axis and disposed such that the top side of the engine tool housing is disposed between (a) the top cover and (b) the cylinder and the crank case;
   an air cleaner room disposed adjacent to the rear side of the engine tool housing and retaining an air cleaner; and
   an air inlet at the front of the engine tool, wherein
   the top cover is connected with the engine tool housing with a predetermined clearance so as not to closely contact the top side of the engine tool housing and thus form a flow space between the top side of the engine tool housing covering the cylinder and the crank case and the top cover to allow external air suctioned from the air inlet to flow through the flow space formed between the engine tool housing and the top cover, and be introduced into either one of or both of the air cleaner room and the engine tool housing.

2. The engine tool according to claim 1, further comprising a handle part provided above the top cover and configured to be held by a user, and wherein the external air flows through a space between an area of the top cover where the handle part is provided and the engine tool housing.

3. The engine tool according to claim 1, wherein the air inlet is provided at a front side of the engine tool and for introducing the external air, and the air cleaner room is provided at a rear side of the engine tool opposite to the front side of the engine tool.

4. The engine tool according to claim 3, wherein the air inlet is an opening formed in a front part of the top cover or a space formed at a part where the top cover and the engine tool housing are connected together.

5. The engine tool according to claim 1, wherein the air cleaner room has a first air inlet for introducing external air flowing through a space between the engine tool housing and an air cleaner room cover covering the engine tool housing, and a second air inlet for introducing external air flowing through a space between the engine tool housing and the top cover.

6. The engine tool according to claim 1, wherein the fan is provided at a crank shaft of the engine to drive air into the engine tool housing to cool down the engine, and wherein
   the external air introduced in the engine tool housing by the fan cools down a cylinder of the engine, and is exhausted to an exterior of the engine tool housing.

7. The engine tool according to claim 5, wherein
   the first air inlet is opened downwardly from the air cleaner room, and
   the second air inlet is communicated with the space formed between the engine tool housing and the top cover from the air cleaner room.

8. The engine tool according to claim 7, further comprising a carburetor disposed in the air cleaner room.

9. The engine tool of claim 1, wherein a central portion of the top side of the engine tool housing is lower than an end thereof, such that the top cover and the top side of the engine tool housing form a path for air flow.

10. The engine tool according to claim 1, wherein the external air introduced into the engine tool housing via the fan is drawn through a second air inlet different than the air inlet through which external air is suctioned to flow through the flow space.

11. The engine tool according to claim 10, wherein a portion of the top side of the engine tool housing is disposed directly between the crank case and the flow space so that the external air suctioned through the air inlet removes heat from said portion of the top side of the engine tool housing.

* * * * *